United States Patent
Bigl et al.

(10) Patent No.: US 11,723,177 B2
(45) Date of Patent: Aug. 8, 2023

(54) COOLING DEVICE WITH FIBER ATTACHMENT BETWEEN HEATING TUBE AND COOLING ELEMENT

(71) Applicant: SIEMENS AKTIENGESELLSCHAFT, Munich (DE)

(72) Inventors: Thomas Bigl, Herzogenaurach (DE); Alexander Hensler, Gerhardshofen (DE); Stephan Neugebauer, Erlangen (DE); Ewgenij Ochs, Fürth (DE); Philipp Oschmann, Erlangen (DE); Stefan Pfefferlein, Heroldsberg (DE); Ulrich Wetzel, Adelsdorf (DE)

(73) Assignee: Siemens Aktiengesellschaft, Munich (DE)

( * ) Notice: Subject to any disclaimer, the term of this patent is extended or adjusted under 35 U.S.C. 154(b) by 155 days.

(21) Appl. No.: 17/290,587

(22) PCT Filed: Oct. 31, 2019

(86) PCT No.: PCT/EP2019/079796
§ 371 (c)(1),
(2) Date: Apr. 30, 2021

(87) PCT Pub. No.: WO2020/089377
PCT Pub. Date: May 7, 2020

(65) Prior Publication Data
US 2022/0007543 A1    Jan. 6, 2022

(30) Foreign Application Priority Data
Nov. 2, 2018  (EP) ..................................... 18204081

(51) Int. Cl.
*H05K 7/20*       (2006.01)
*F28F 21/08*      (2006.01)
(Continued)

(52) U.S. Cl.
CPC ....... *H05K 7/20445* (2013.01); *F28F 21/085* (2013.01); *H05K 7/20336* (2013.01);
(Continued)

(58) Field of Classification Search
CPC .......... H05K 7/20336; H05K 7/20409–20418; H05K 7/20436; H05K 7/20445;
(Continued)

(56) References Cited

U.S. PATENT DOCUMENTS

| 7,540,318 B2 * | 6/2009 | Nitta ..................... H01L 23/427 257/715 |
| 8,353,334 B2 * | 1/2013 | Zhao ..................... F28D 15/046 261/99 |

(Continued)

FOREIGN PATENT DOCUMENTS

| DE | 202015101819 U1 | 7/2015 | |
| EP | 2209173 A1 * | 7/2010 | ............... H01S 3/04 |

(Continued)

OTHER PUBLICATIONS

PCT International Search Report and Written Opinion of International Searching Authority dated Feb. 13, 2020 corresponding to PCT International Application No. PCT/ EP2019/079796 filed Oct. 31, 2019.

*Primary Examiner* — Zachary Pape
(74) *Attorney, Agent, or Firm* — Henry M. Feiereisen LLC

(57) ABSTRACT

A cooling device for heat dissipation from an electronic component includes a heating tube having a heating tube surface, a cooling element having a first cooling element side formed with a slot recess which at least partially encloses the heating tube, and a fiber structure made of fibers and arranged on the heating tube surface in a region in which the heating tube is at least partially enclosed by the slot (Continued)

recess. The fibers on the heating tube surface of the heating tube in the region of the slot recess form a mechanical connection with a cooling element surface of the cooling element.

15 Claims, 4 Drawing Sheets

(51) Int. Cl.
    *H01L 23/373* (2006.01)
    *H01L 23/427* (2006.01)
(52) U.S. Cl.
    CPC ..... *H05K 7/20409* (2013.01); *H05K 7/20936* (2013.01); *H01L 23/373* (2013.01); *H01L 23/427* (2013.01)
(58) Field of Classification Search
    CPC . H05K 7/2089–20918; H05K 7/20936; H01H 9/52; F28F 21/085; H01L 23/427; H01L 23/373
    See application file for complete search history.

(56) References Cited

U.S. PATENT DOCUMENTS

| | | | | |
|---|---|---|---|---|
| 9,653,968 | B2* | 5/2017 | Andersen | H02K 5/225 |
| 10,012,445 | B2* | 7/2018 | Lin | H01L 23/427 |
| 2012/0325440 | A1* | 12/2012 | Honmura | F28D 15/046 |
| | | | | 165/104.26 |
| 2016/0265857 | A1 | 9/2016 | Benthem | |
| 2017/0003035 | A1* | 1/2017 | Wischemann | F24D 3/142 |
| 2017/0156240 | A1* | 6/2017 | Silvennoinen | H05K 7/20936 |
| 2018/0301959 | A1* | 10/2018 | Wettlaufer | H02K 11/0094 |

FOREIGN PATENT DOCUMENTS

| | | | | |
|---|---|---|---|---|
| JP | 56138688 A | * | 10/1981 | |
| WO | WO-0167019 A1 | * | 9/2001 | F28D 15/04 |

* cited by examiner

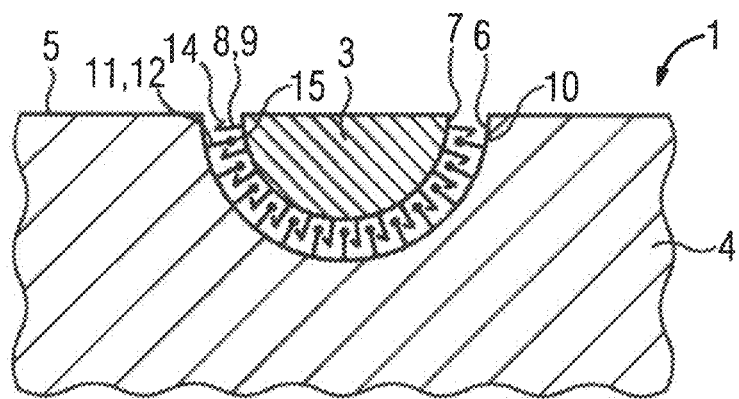
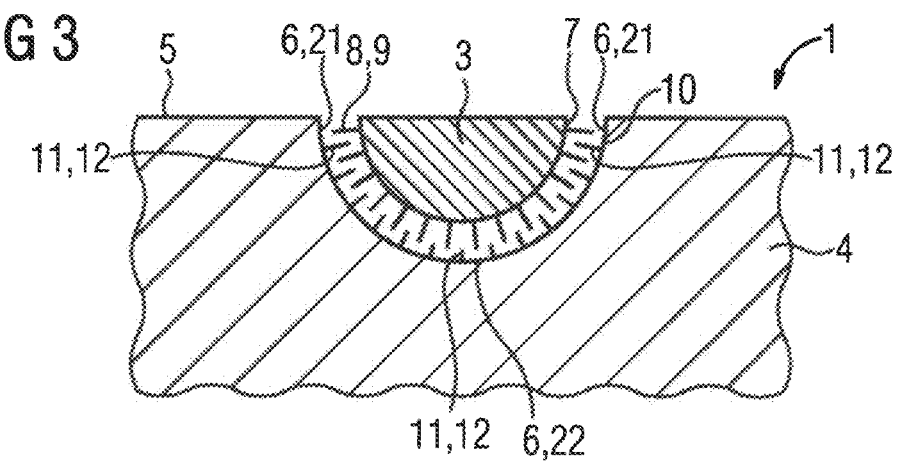
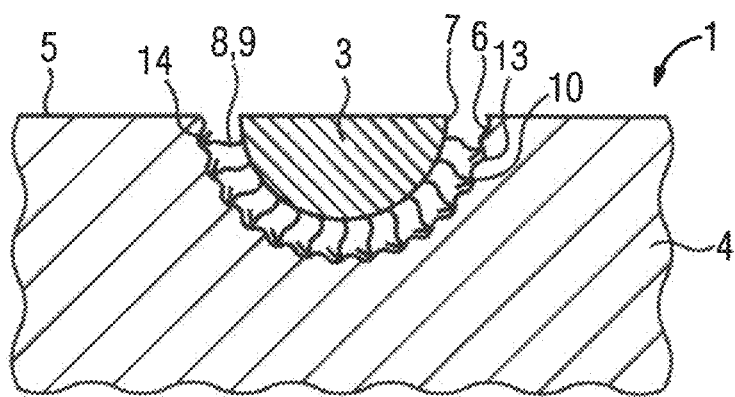

COOLING DEVICE WITH FIBER ATTACHMENT BETWEEN HEATING TUBE AND COOLING ELEMENT

CROSS-REFERENCES TO RELATED APPLICATIONS

This application is the U.S. National Stage of International Application No. PUT/EP/2019/079796, filed Oct. 31, 2019, which designated the United States and has been published as International Publication No. WO 2020/089377 A1 and which claims the priority of European Patent Application, Ser. No. 18204081.6, filed Nov. 2, 2018, pursuant to 35 U.S.C. 119(a)-(d).

BACKGROUND OF THE INVENTION

The invention relates to a cooling device for heat dissipation from an electronic component, wherein the cooling device comprises a heating tube and a cooling element and the cooling element has a slot recess running on a first cooling element side and at least partially surrounding the heating tube.

In drive technology electric devices, such as, for instance, frequency converters, heating tubes, like e.g. heat pipes, are used for heat dissipation of the heat losses occurring during operation in particular from electronic components of power electronics in the medium and higher power range, wherein one or more heating tubes dispense the heat losses in or on an aluminum cooling element, for instance, uniformly away from the heat source to cooler points in the cooling element and thus dissipate the same efficiently.

Establishing a mechanically stable and thermally effective connection of the heating tube with the cooling element is a complex and time-consuming process. The manufacturing costs of a cooling element with an implemented heating tube therefore sometimes increase to twice those involved in manufacturing a cooling element without a heating tube. With many electric apparatuses, these manufacturing costs of the cooling element with the heating tube exceed the planned budget, with the result that particularly with expected high power losses, the cooling elements are in particular dimensioned with a larger volume. The disadvantages are however that a correspondingly larger installation space has to have priority in the electric devices and realization of a more compact structure of the electric devices is only possible with more difficulty.

In order to implement heating tubes in the cooling elements, the heating tubes are introduced into contact surfaces of the cooling element so that, for instance, slots for the heating tubes can be incorporated, often milled into, the cooling element, and map the shape and the cross-section of the respective heating tube. Before the heating tube is injected into the corresponding cooling element slot under pressure, a thermally-conductive material, which is embodied in most cases as an adhesive, is applied to the cooling element slot in the form of a thermally-conductive adhesive. After injecting the heating tube into the slot of the cooling element, the thermally-conductive adhesive is dried so that this thermally-conductive adhesive bonding cures. The surface of the cooling element with the injected heating tube is then generally milled once more in order to remove material unevennesses and residues from the thermally-conductive adhesive.

In contrast with metal compounds made from copper and/or aluminum, for instance, the disadvantage with a thermally-conductive adhesive consists of its significantly poorer thermal conductivity, which is, however, better than the enclosed air occurring partially in the injection cavities. Thermal barriers of this type for heat transportation are at least reduced by the thermally-conductive adhesive.

A further decisive disadvantage is that after often short operating times, the thermally-conductive adhesive introduced between the cooling element and the heating tube can clump or become brittle. The thermal resistance of the cooling element will then increase significantly to some extent and compromise the operation of the electronic component to be cooled in the electric device or destroy the electronic component and thus possibly the entire electric device.

The object underlying the invention is therefore to provide a cooling device with a heating tube and a cooling element, the mechanical/thermal connection of which is improved compared with the prior art.

SUMMARY OF THE INVENTION

The object is achieved by a cooling device as set forth hereinafter, and by a converter with the cooling device as according to the invention.

To achieve the object a cooling device is proposed, which comprises a heating tube and a cooling element for heat dissipation from an electronic component, wherein the cooling element has a slot recess running on a first cooling element side and at least partially surrounding the heating tube, wherein a heating tube surface of the heating tube in the region surrounded by the slot recess has a fiber structure consisting of first fibers and wherein the first fibers of the heating tube surface of the heating tube in the region of the slot recess form a mechanical connection to a cooling element surface of the cooling element.

By means of the advantageous use of the first fibers of the fiber structure of the heating tube, which have in particular a material like that of the heating tube, gaps, which may generally occur in the microscopic range when the heating tube is injected into the slot recess of the cooling element, were filled and thus bridged. The pressure force exerted during the injection process has generally caused the heating tube surface of the heating tube to be connected with a material-bond in a non-detachable or at least restrictedly detachable manner with the metallic cooling element surface of the cooling element by means of the metallic first fibers. In this context, the first fibers are the component part of the heating tube surface of the heating tube.

It is therefore possible to dispense with using a thermally-conductive adhesive for the mechanical/thermal connection between the heating tube and cooling element, so that the known clumping together or brittling of the thermally-conductive adhesives no longer has a negative influence on the thermal resistance value of the thermal connection between the heating tube and cooling element and a mechanically more stable metallic connection is also carried out here.

Advantageous embodiments of the modular converter are specified in the dependent claims.

With a first advantageous embodiment of the cooling device the first cooling element surface in the region of the slot recess has a further fiber structure made from second fibers and the first fibers of the heating tube surface of the heating tube in the region of the slot recess form a mechanical connection with the second fibers of the cooling element surface of the cooling element.

The fiber structure and the further fiber structure in each case have a brush-type geometry by means of the first and second fibers. Plaiting or entangling the first fibers of the heat tube surface of the heat tube with the second fibers of the cooling element surface of the cooling element advantageously produces a mechanical and also thermal connection between the heating tube surface and the cooling element surface and thus of the heating tube with the cooling element. This reinforces in particular the material-bonded mechanical connection between the heating tube and the cooling element and further improves its thermal coupling.

The second fibers are, where appropriate, a component part of the cooling element surface of the cooling element.

With a further advantageous embodiment of the cooling device the second fibers, which are arranged on the slot edges of the slot recess, are longer than the second fibers which are arranged on the slot base of the slot recess.

This embodiment advantageously takes into account that the force exertion mainly exerts its force effect in the direction of the groove base when the heating tube with the cooling element is injected. The mechanical/thermal connection of the longer second fibers to the slot edges with the first fibers arranged there is therefore at least equivalent with respect to mechanical stability and thermal resistance value, as the mechanical/thermal connection of the shorter second fibers on the slot base with the first fibers arranged there.

With a likewise advantageous embodiment of the cooling device the first cooling element surface in the region of the slot recess has a roughened surface structure and the first fibers of the heating tube surface of the heating tube form a mechanical connection with the roughened surface structure of the cooling element surface of the cooling element in the region of the slot recess.

The first fibers of the heating tube surface of the heating tube wind around the roughened surface structure or become wedged together between the roughened surface structure of the cooling element surface of the cooling element and form an advantageous mechanical and also thermal connection between the heating tube surface and the cooling element surface and thus the heating tube with the cooling element.

With a further advantageous embodiment of the cooling device the first fibers of the heating tube surface of the heating tube penetrate the cooling element surface of the cooling element in the region of the slot recess.

The first fibers of the heating tube surface of the heating tube penetrate the cooling element surface of the cooling element in such a way that they advantageously connect in particular in a mechanically material-bonded manner with the cooling element surface. Furthermore, they can also penetrate more deeply into the base structure of the cooling element, which further improves the mechanical and thus also the thermal connection between the heating tube and the cooling element.

With a likewise advantageous embodiment of the cooling device the first fibers of the fiber structure and, where appropriate, the second fibers of the further fiber structure or the roughened surface structure, have a nano-scale or micro-scale structure.

By means of this nano-scale or micro-scale structure of the first fibers of the fiber structure and, where appropriate, the second fibers of the further fiber structure, injection cavities with e.g. air pockets, which could appear as a result of injecting the heating tube into the cooling element, are advantageously filled with metallic material of the fibers in a fine grade manner so that in particular the thermal resistance of the thermal connection of the heating tube with the cooling element is further improved compared with introducing the thermally-conductive adhesive. Nano-scale or micro-scale structures are understood to mean dimensions of elements or structures, which are only visible to the human eye when significantly enlarged in a nano-scale range of nanometers or in a micro-scale range of micrometers.

With a further advantageous embodiment of the cooling device, the first fibers have barbed hooks, and where appropriate, the second fibers have eyelets.

The barbed hook establishes a mechanical connection between the first fibers and the cooling element surface, which can barely be separated without destruction. If the second fibers are present on the cooling element surface, the barbed hooks and the eyelets, in which the barbed hooks are anchored, form an improved, more stable mechanical connection. Eyelets are also understood to mean openings in the second fibers, which are formed by pushing barbed hooks through the second fibers when the heating tube is injected into the cooling element. Connections which have fibers with barbed hooks and eyelets are also referred to as hook-and-loop fasteners.

With a likewise advantageous embodiment of the cooling device the first fibers and, where appropriate, the second fibers are embodied by material coating or by material removal.

If the first fibers and, where appropriate, the second fibers are embodied by material coating, its material can differ from the material of the heating tube or the cooling element. The difference in the material of the second fibers of the cooling element surface from the material of the cooling element, in other words from the material of the base structure of the cooling element, is advantageous here. For this purpose the cooling element can consist of aluminum or of an aluminum alloy, while the cooling element surface with the second fibers consists of copper or a copper alloy, for instance. If the first fibers of the heating tube surface of the heating tube are then likewise made from copper, for instance, a very good mechanical material-bonded connection is embodied with a very good thermal heat conductivity.

With a further advantageous embodiment of the cooling device the first fibers of the heating tube surface of the heating tube and, where appropriate, the second fibers of the cooling element surface of the cooling element, consist of copper or of a copper alloy.

The copper or the copper alloy is a material well-suited to the thermal connection between the first fibers of the heating tube surface of the heating tube and the cooling element surface of the cooling element, and where appropriate, with the second fibers of the cooling element surface of the cooling element, since here the thermal resistance of this mechanical/thermal connection is advantageously reduced compared with, for instance, a connection using a thermally-conductive adhesive or compared with, for instance, a connection consisting of aluminum and copper, for instance.

With a likewise advantageous embodiment of the cooling device the material of the first fibers of the heating tube is mechanically harder than the material of the cooling element surface of the cooling element.

Since the material of the first fibers is advantageously harder than the material of the cooling element surface of the cooling element, the cooling element surface is intensively penetrated by the first fibers, which increases the stability of the mechanical connection, particularly if the first fibers join by way of barbed hooks. Furthermore, the first fibers can penetrate the base structure of the cooling element even better by way of the cooling element surface.

With a further advantageous embodiment of the cooling device, the heating tube is a heat pipe.

The use of a heating tube as a heating tube in the cooling device is advantageous in that heating tubes can be used both horizontally and/or also in a vertical installation position, contrary to two-phase thermosiphons which are gravity-driven. Furthermore, the purchasing costs of heating tubes are also low for the heat dissipation from electronic components of higher performance classes, since they are produced as mass articles, wherein the cooling device can then likewise be offered in a cost-effective manner.

With a likewise advantageous embodiment of the cooling device, the cooling element has cooling element ribs on a second cooling element side facing away from the first cooling element side.

The cooling element ribs on the cooling element, combined with the heating tube, support the heat dissipation from electronic components during operation, by it being possible to advantageously output their heat losses to the environment.

To achieve the object, a converter for operating an electric machine on an electric network with the inventive cooling device and an electronic component is further proposed, wherein the electronic component is mechanically connected to a cooling element of the cooling device in the region of a heating tube of the cooling device which is at least partially surrounded by the cooling element.

During operation of the converter or during operation of the electronic component, the heat losses generated there is advantageously routed away from the electronic component by means of the heating tube integrated into the cooling element and output by the cooling element to the environment.

With an advantageous embodiment of the converter the cooling element is embodied as a converter housing or as part of a converter housing.

The cooling device, in other words the cooling element with the integrated heating tube, can advantageously be arranged here for the converter from the perspective of the spatial arrangement and expansion, wherein available or requisite building structures of the converter, in other words the converter housing, are used.

With a further advantageous embodiment of the converter the electronic component is a power semiconductor or a power semiconductor module.

The power semiconductor module can have a plurality of power semiconductors, which are cooled during operation of the converter or of the power semiconductor module by means of the cooling device.

BRIEF DESCRIPTION OF THE DRAWING

The above-described characteristics, features and advantages of this invention, as well as the manner in which these are realized, will become dearer and more readily understandable in connection with the following description of the exemplary embodiments, which are explained in more detail in conjunction with the drawings, in which:

FIG. 2 shows a first schematic sectional representation of an inventive cooling device with first fibers of a fiber structure and second fibers of a further fiber structure, FIG. 3 shows a second schematic sectional representation of an inventive cooling device with first fibers of a fiber structure and second fibers of a further fiber structure, FIG. 4 shows a third schematic sectional representation of an inventive cooling device with a roughened surface structure of a cooling element surface of a cooling element.

DETAILED DESCRIPTION OF PREFERRED EMBODIMENTS

Figure 1:
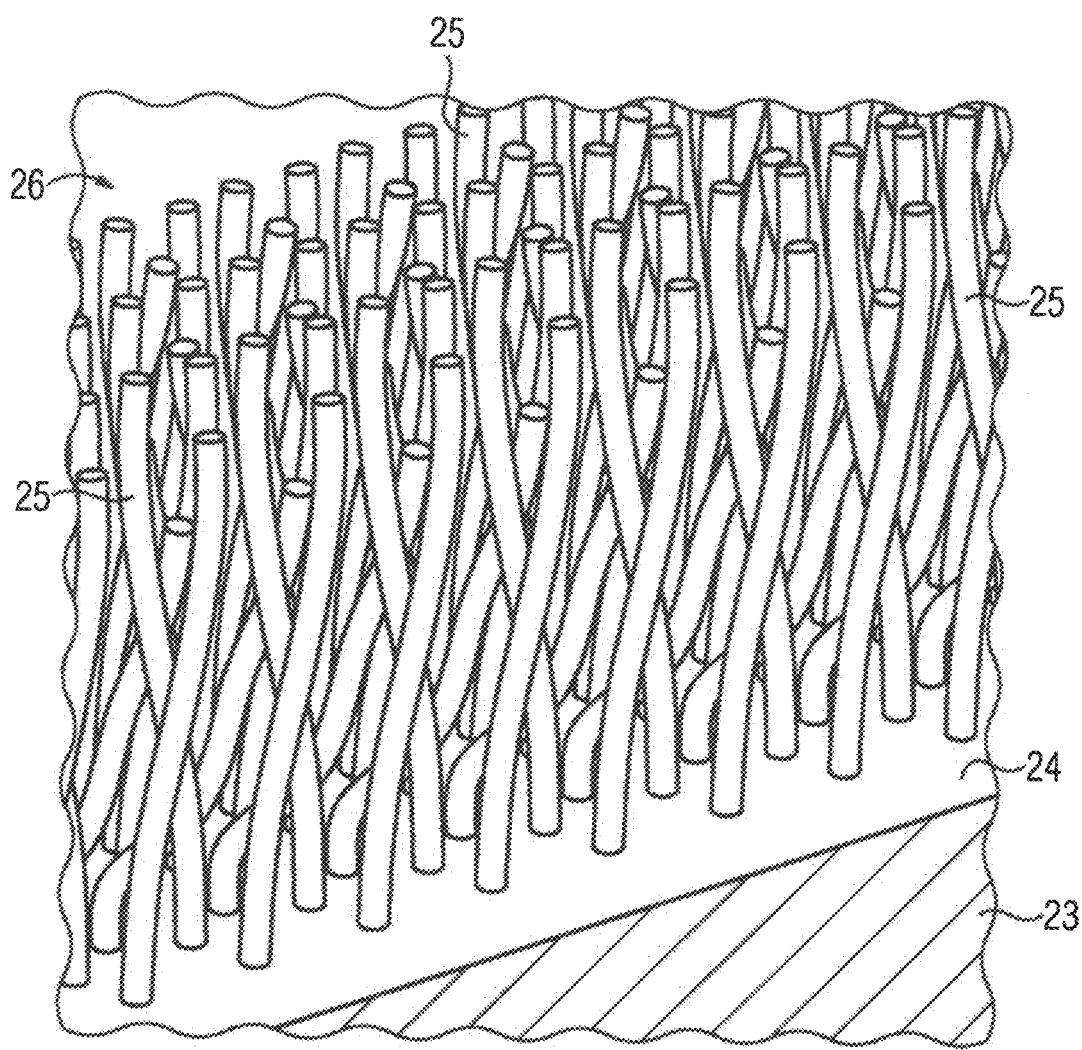
FIG. 1 shows a schematic representation of a metal fiber structure on a surface of a metal element.

FIG. 1 shows a schematic representation of a metal fiber structure 26 on a surface 24 of a metal element 23. The metal fiber structure 26 has metal fibers 25, which project substantially at right angles from the surface 24 of the metal element 23. The schematic representation in FIG. 1 is enlarged here since here the metal fibers 25 of the metal fiber structure 26 are embodied in the nano-scale or micro-scale range.

All FIGS. 2 to 7 described below are significantly enlarged in their schematic representation and show a cooling device 1 in a in particular nano-scale or micro-scale range with a mechanical/thermal connection of a heating tube 2 to a cooling element 4.

FIG. 2 shows a first schematic sectional representation of an inventive cooling device 1 with first fibers 9 of a fiber structure 8 and second fibers 12 of a further fiber structure 11.

A heating tube 3 of the cooling device 1 is mechanically connected to a cooling element 4 of the cooling device 1 by way of the first fibers 9 of the fiber structure 8 on the heating tube surface 7 of the heating tube and the second fibers 12 of the further fibers structure 11 on the cooling element surface 10 of the cooling element 4. The heating tube 3 is partially enclosed here by a slot recess 6, which is arranged on a first cooling element side 5 of the cooling element 4, wherein the first and the second fibers 9, 12 are arranged in the region of the enclosure. The mechanical connection is substantially a material-bonded connection (shown significantly enlarged here). The heating tube 3 and the cooling element 4 form a planar surface on the first cooling element side 5 of the cooling element 4.

The first fibers 9 further have barbed hooks 14 and the second fibers 12 have eyelets 15, wherein the barbed hooks 14 of the first fibers 9 connect mechanically with the eyelet 15 of the second fibers 12 (only visualized in outlines in FIG. 2). This connection is mechanically very stable and can be referred to as a hook-and-loop fastener connection.

FIG. 3 shows a second schematic sectional representation of an inventive cooling device 1 with first fibers 9 of a fiber structure 8 and second fibers 12 of a further fiber structure 11.

A heating tube 3 of the cooling device 1 is mechanically connected to a cooling element 4 of the cooling device 1 by way of the first fibers 9 of the fiber structure 8 on the healing tube surface 7 of the heating tube 3 and the second fibers 12 of the further fiber structure 11 on the cooling element surface 10 of the cooling element 4. The heating tube 3 is partially enclosed here by a slot recess 6, which is arranged on a first cooling element side 5 of the cooling element 4, wherein the first and the second fibers 9, 12 are arranged in the region of the enclosure. The mechanical connection is substantially a material-bonded connection (shown significantly enlarged here). The heating tube 3 and the cooling element 4 form a planar surface on the first cooling element side 5.

The mechanical connection between the heating tube 3 and the cooling element 4 was carried out by means of injecting the heating tube 3 into the cooling element 4 on its first cooling element side 5, wherein upon injection its force effect is mainly exerted in the direction of the slot base 22 of the slot recess 6.

FIG. 3 shows the result of injection in the form of an efficient mechanical/thermal connection between the heating tube 3 and the cooling element 4, wherein the connection of the longer second fibers 12 to the slot edges 21 of the slot recess with the first fibers 9 arranged there is at least equivalent with respect to the mechanical stability and the thermal resistance value, as the connection between the shorter second fibers 12 to the slot base 22 of the slot recess 6 with the first fibers 9 arranged there.

FIG. 4 shows a third schematic sectional representation of an inventive cooling device 1 with a roughened surface structure 13 of a cooling element surface 10 of a cooling element 4.

A heating tube 3 of the cooling device 1 is mechanically connected to a cooling element 4 of the cooling device 1 by way of the first fibers 9 of the fiber structure 8 on the heating tube surface 7 of the heating tube 3 and the roughened surface structure 13 of the cooling element surface 10 of the cooling element 4. The heating tube 3 is enclosed here partially by a slot recess 6, which is arranged on a first cooling element side 5 of the cooling element 4, wherein the first fibers 9 and the roughened surface structure 13 are arranged in the region of the enclosure. The mechanical connection is substantially a material-bonded connection (shown significantly enlarged here). The heating tube 3 and the cooling element 4 form a planar surface on the first cooling element side 5.

The first fibers 9 of the heating tube surface 7 of the heating tube 3 have barbed hooks 14, which further improve the enclosure or wedging of the roughened surface structure 13 of the cooling element surface 10 of the cooling element 4.

Figure 5:
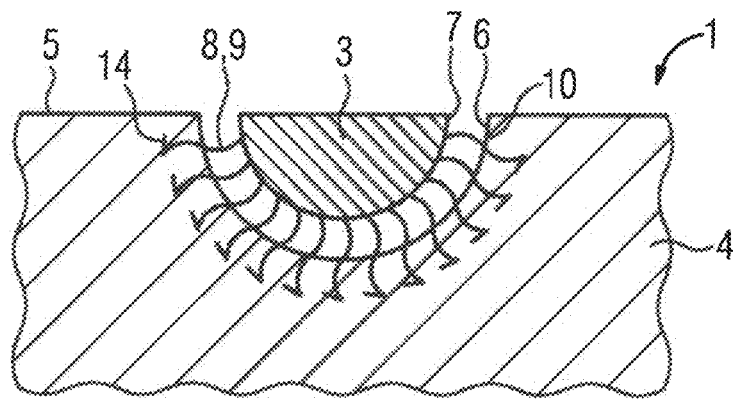
FIG. 5 shows a fourth schematic sectional representation of an inventive cooling device with first fibers penetrating a cooling element surface of a cooling element.

A fourth schematic sectional representation in FIG. 5 visualizes an inventive cooling device 1 with first fibers 9 penetrating a cooling element surface 10 of a cooling element 4.

A heating tube 3 of the cooling device 1 is mechanically connected to a cooling element 4 of the cooling device 1 by way of the first fibers 9 of the fiber structure 8 on the heating tube surface 7 of the heating tube 3, which penetrate the cooling element surface 10 of the cooling element 4. The heating tube 3 is enclosed here partially by a slot recess 6, which is arranged on a first cooling element side 5 of the cooling element 4, wherein the first fibers 9 are arranged in the region of the enclosure. The mechanical connection is substantially a material-bonded connection (shown significantly enlarged here). The heating tube 3 and the cooling element 4 form a planar surface on the first cooling element side 5.

The first fibers 9 of the heating tube surface 7 of the heating tube 3 have barbed hooks 14, which are hooked at least in the cooling element surface 10 of the cooling element 4. FIG. 5 shows furthermore that the first fibers 9 penetrate more deeply into the base structure of the cooling element 4 and are hooked there.

Figure 6:
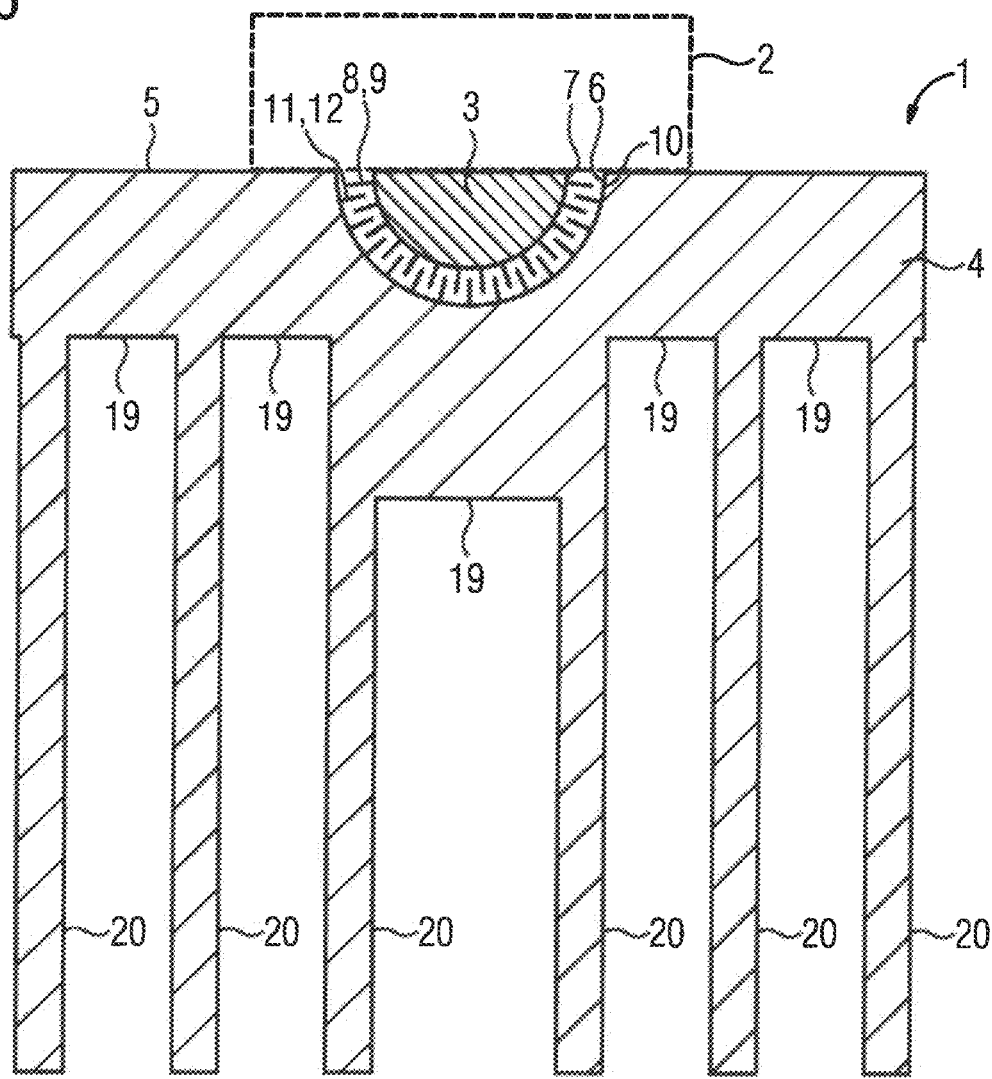
FIG. 6 shows a fifth schematic sectional representation of an inventive cooling device with a connection of an electronic component to the cooling device.

FIG. 6 shows a fifth schematic sectional representation of an inventive cooling device 1 with a connection of an electronic component 2 to the cooling device 1.

A heating tube 3 of the cooling device 1 is mechanically connected to a cooling element 4 of the cooling device 1 by way of the first fibers 9 of the fiber structure 8 on the heating tube surface 7 of the heating tube 3 and the second fibers 12 of the further fiber structure 11 on the cooling element surface 10 of the cooling element 4. The heating tube 3 is enclosed here partially by a slot recess 6, which is arranged on a first cooling element side 5 of the cooling element 4, wherein the first and the second fibers 9, 12 are arranged in the region of the enclosure. The mechanical connection is substantially a material-bonded connection (shown significantly enlarged here). The heating tube 3 and the cooling element 4 form a flat surface on the first cooling element side 5.

The electronic component 2 is arranged on the planar surface of the first cooling element side 5 by way of the heating tube 3 so that during operation it can be cooled by means of the heating tube 3 and the cooling element 4.

The cooling element 4 has cooling element ribs 20 on a second cooling element side 19 facing away from the first cooling element side 5. During operation these cooling element ribs 20 of the cooling element 4 support the heat dissipation from the electronic component 2, combined with the heating tube 3, by them advantageously outputting the heat losses of the electronic component 2 into the environment.

Figure 7:
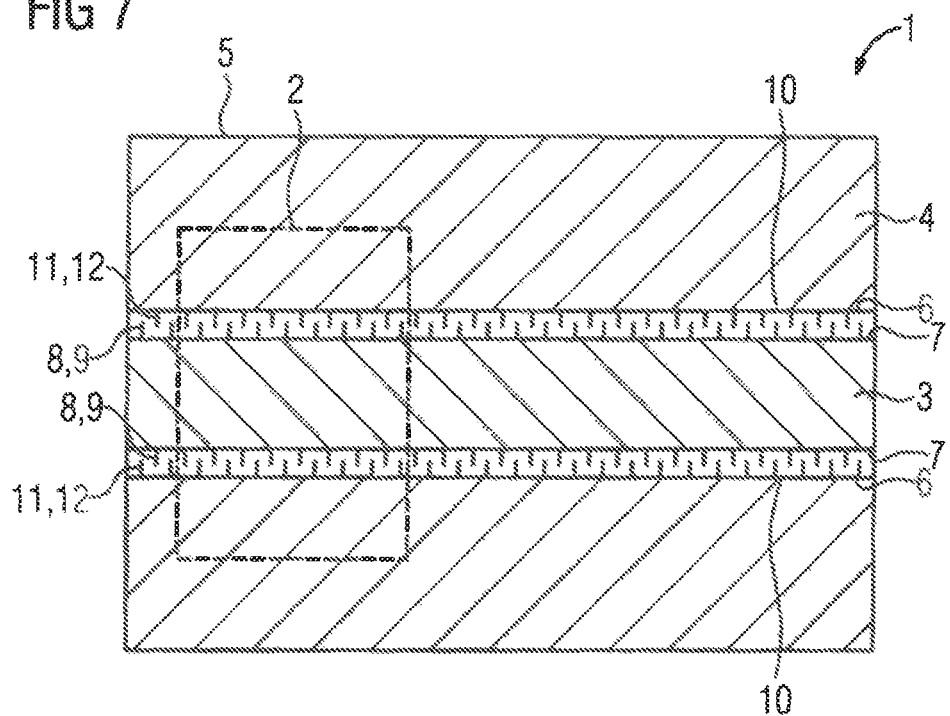
FIG. 7 shows a schematic representation of the top view onto the inventive cooling device according to FIG. 6.

FIG. 7 shows a schematic representation of a top view onto the inventive cooling device 1 according to FIG. 6.

The cooling element ribs shown in FIG. 6 are however to be inferred from FIG. 7, since for reasons of clarity the second cooling element side facing away from the first cooling element side 5 with the cooling element ribs arranged there are not shown.

Figure 8:
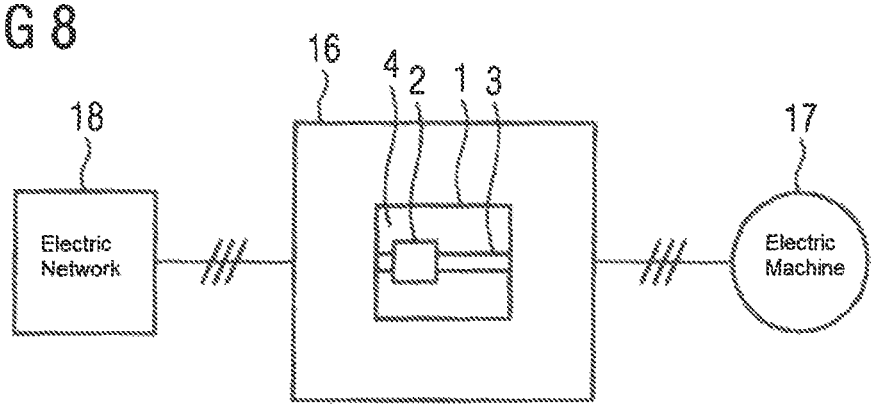
FIG. 8 shows a schematic representation of a converter with the inventive cooling device according to FIGS. 2 to 7.

FIG. 8 shows a schematic representation of a converter 16 with the inventive cooling device 1 according to FIGS. 2 to 7.

The converter 16 is connected here by way of example to an electric network 18 and an electric machine 17 by way of an electric three phase line in each case, wherein during operation the converter 16 generally supplies the electric machine 17 with electric energy from the electric network 18 in a torque- and speed-dependent manner.

The electronic component 2 is arranged on a cooling element 4 and a heating tube 3 of the cooling device 1 which is integrated into the cooling element 4. The heat losses generated during operation of the electronic component 2 can then be conducted to cooler areas of the cooling element 4 by means of the heating tube 3 and mainly output via the cooling element 4 to the environment inside or outside of the converter 16.

What is claimed is:

1. A cooling device for heat dissipation from an electronic component, said cooling device, comprising
   a heating tube having a heating tube surface;
   a cooling element having a first cooling element side formed with a slot recess which at least partially encloses the heating tube;
   a first fiber structure made of fibers and arranged on the heating tube surface in a region in which the heating tube is at least partially enclosed by the slot recess; and
   a second fiber structure made from fibers and arranged on a cooling element surface in the region of the slot recess, said fibers on the heating tube surface of the heating tube forming in the region of the slot recess a mechanical connection with the fibers on the cooling element surface of the cooling element.

2. The cooling device of claim 1, wherein the fibers of the second fiber structure in proximity of slot edges of the slot recess are sized longer than the fibers of the second fiber structure in proximity of a slot base of the slot recess.

3. The cooling device of claim 1, wherein the fibers of the first fiber structure have a nano-scale or micro-scale structure.

4. The cooling device of claim 1, wherein the fibers of the second fiber structure have a nano-scale or micro-scale structure.

5. The cooling device of claim 1, wherein the fibers of the first fiber structure have barbed hooks for engagement in eyelets of the fibers of the second fiber structure to establish the mechanical connection.

6. The cooling device of claim 1, wherein the fibers of the first fiber structure are formed by a material coating or by material removal.

7. The cooling device of claim 1, wherein the fibers of the second fiber structure are formed by a material coating or by material removal.

8. The cooling device of claim 1, wherein the fibers of the first fiber structure are made of copper or of a copper alloy.

9. The cooling device of claim 1, wherein the fibers of the second fiber structure are made of copper or of a copper alloy.

10. The cooling device of claim 1, wherein the fibers of the first fiber structure is made of a material which is mechanically harder than a material of the cooling element surface of the cooling element.

11. The cooling device of claim 1, wherein the heating tube is a heat pipe.

12. The cooling device of claim 1, wherein the cooling element has a second cooling element side which faces away from the first cooling element side and includes cooling element ribs.

13. A converter for operating an electric machine on an electric network, said converter comprising;

a cooling device comprising a heating tube having a heating tube surface, a cooling element having a first cooling element side formed with a slot recess which at least partially encloses the heating tube, and a first fiber structure made of fibers and arranged on the heating tube surface in a region in which the heating tube is at least partially enclosed by the slot recess, a second fiber structure made from fibers and arranged on a cooling element surface in the region of the slot recess, said fibers on the heating tube surface of the heating tube in the region of the slot recess forming a mechanical connection with the fibers on the cooling element surface of the cooling element; and an electronic component mechanically connected to the cooling element of the cooling device in the region of the heating tube of the cooling device.

14. The converter of claim 13, wherein the cooling element is embodied as a converter housing or as part of a converter housing.

15. The converter of claim 13, wherein the electronic component is a power semiconductor or a power semiconductor module.

* * * * *